United States Patent [19]

Evans et al.

[11] Patent Number: 4,841,159

[45] Date of Patent: Jun. 20, 1989

[54] SWITCHING AND TESTING SYSTEM

[75] Inventors: Vernon C. Evans, New Athens; George H. Heidinger, Sparta, both of Ill.

[73] Assignee: Peabody Coal Company, St. Louis, Mo.

[21] Appl. No.: 902,217

[22] Filed: Aug. 29, 1986

[51] Int. Cl.$^4$ .................... H02J 3/14; G08B 19/00
[52] U.S. Cl. ................... 307/38; 307/10.1; 307/39; 307/35; 361/92; 361/104; 219/497; 340/642
[58] Field of Search ............... 307/34–41, 307/10 R, 10 LS, 112, 113, 114; 361/42, 49, 89, 90, 91, 92, 88, 71, 78, 104, 101; 340/52 R, 52 D, 52 F, 641, 642, 650, 651; 299/1, 12; 219/497, 499; 324/73 PC, 60 C

[56] References Cited

U.S. PATENT DOCUMENTS

| | | |
|---|---|---|
| 2,874,337 | 2/1959 | Sorensen . |
| 2,991,397 | 7/1961 | Place . |
| 3,066,284 | 11/1962 | McKinley et al. . |
| 3,532,936 | 10/1970 | Kuster .................... 361/92 |
| 3,609,459 | 9/1971 | Thompson . |
| 3,946,279 | 3/1976 | Paice et al. . |
| 3,975,663 | 8/1976 | Moorey . |
| 4,038,584 | 7/1977 | Tarchalski et al. .......... 361/104 |
| 4,042,864 | 8/1977 | Norris ..................... 318/257 |
| 4,053,868 | 10/1977 | Cox et al. ............... 307/10 R X |
| 4,159,501 | 6/1979 | White . |
| 4,259,659 | 3/1981 | Ariyoshi et al. ........... 340/642 X |
| 4,296,450 | 10/1981 | Paice et al. . |
| 4,340,920 | 7/1982 | Gill et al. ................ 361/49 |
| 4,451,822 | 5/1984 | Verse et al. .............. 340/642 |
| 4,454,555 | 6/1984 | DeLacy ................... 361/59 |
| 4,499,385 | 2/1985 | Slavik ................... 307/35 X |
| 4,509,102 | 4/1985 | Ayer ..................... 361/92 |
| 4,554,439 | 11/1985 | Cross et al. ............. 219/497 |
| 4,589,049 | 5/1986 | Krumrein ................ 361/91 X |
| 4,612,595 | 9/1986 | Gill et al. ............... 361/93 |
| 4,629,976 | 12/1986 | Pipkorn ................ 324/73 PC |
| 4,639,609 | 1/1987 | Floyd et al. ............. 307/39 X |
| 4,659,942 | 4/1987 | Volp .................... 307/112 X |

Primary Examiner—William M. Shoop, Jr.
Assistant Examiner—Paul Ip
Attorney, Agent, or Firm—Senniger, Powers, Leavitt and Roedel

[57] ABSTRACT

A switching system for powering first and second electrical loads from a voltage supply, the electrical loads being operable from controls and adapted to be connected to the voltage supply by the switching system. The switching system includes switching circuitry having a control element which is responsive to a control voltage difference to cause the switching circuitry to become conductive, the switching circuitry having a switch terminal connected to a first supply line and another switch terminal connected to the first electrical load. The switching system also includes additional circuitry responsive to the controls for generating the control voltage difference when the voltage supply is connected to the first supply line thereby powering the first electrical load from the first supply line. The switching system further includes further circuitry responsive to the controls for generating first and second control signals. Also included in the switching system is a contactor responsive to the second control signal for connecting the voltage supply to a second supply line, the second electrical load connected to the second supply line and another contactor responsive to the first control signal for connecting the second supply line to the first supply line thereby connecting the voltage supply to the first supply line and for disconnecting the second supply line from the first supply line to interrupt power through the switching circuitry thereby discontinuing the supply of power to the first electrical load. Other forms of the switching system and a testing system are also disclosed.

16 Claims, 9 Drawing Sheets

FIG. 4A    SCR MODULES AND MOTORS
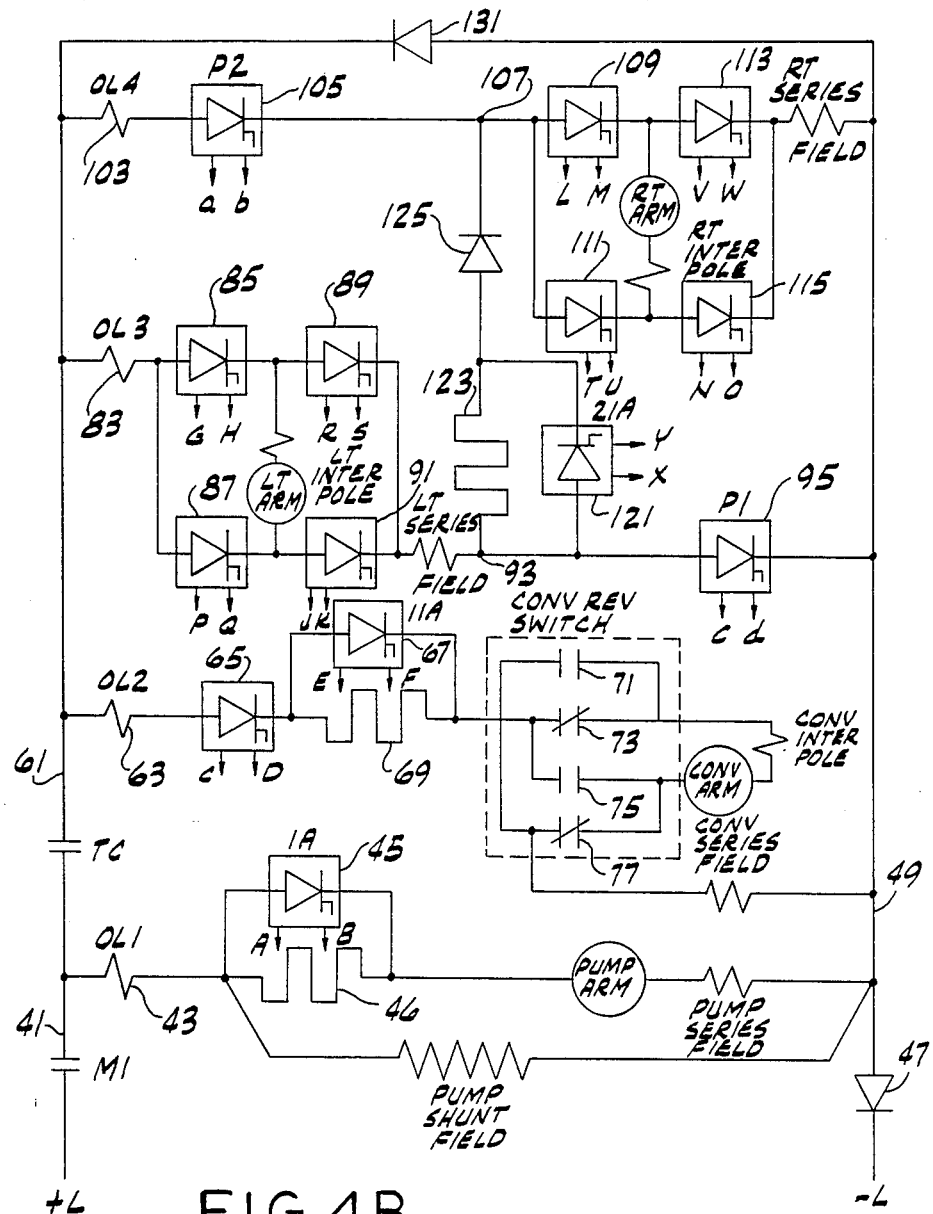
FIG. 4B
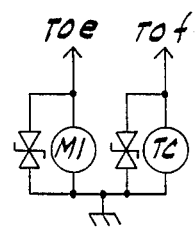

FIG. 7 SCR MODULE
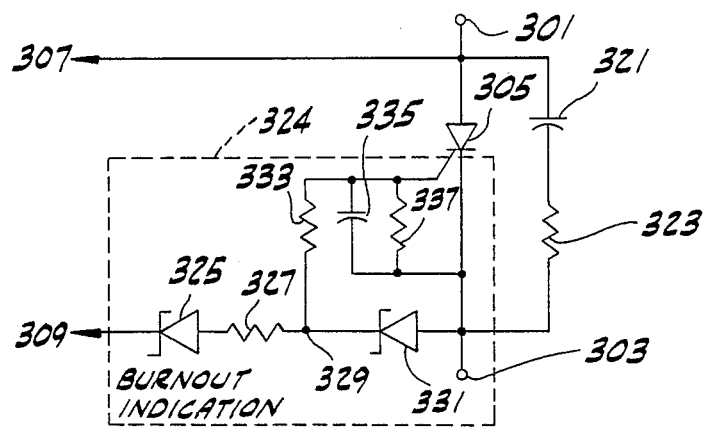
FIG. 8
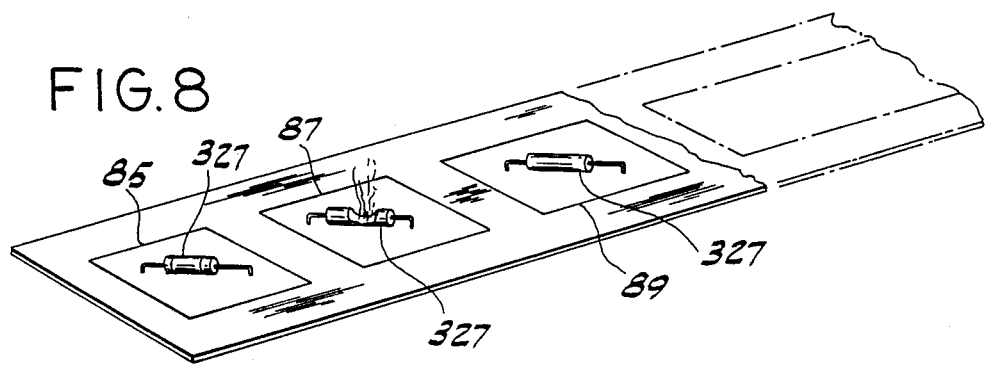
FIG. 10
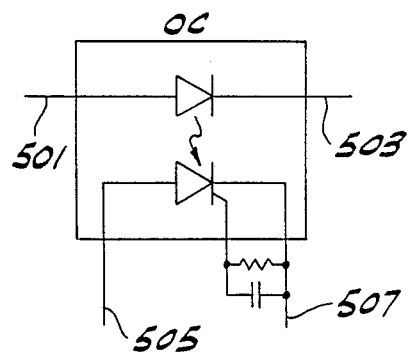
FIG. 11
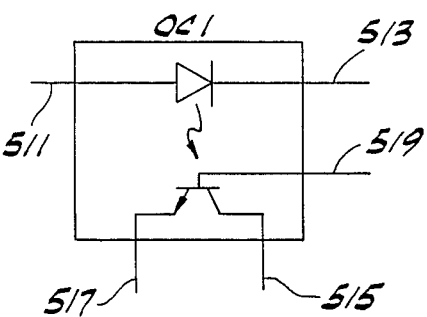

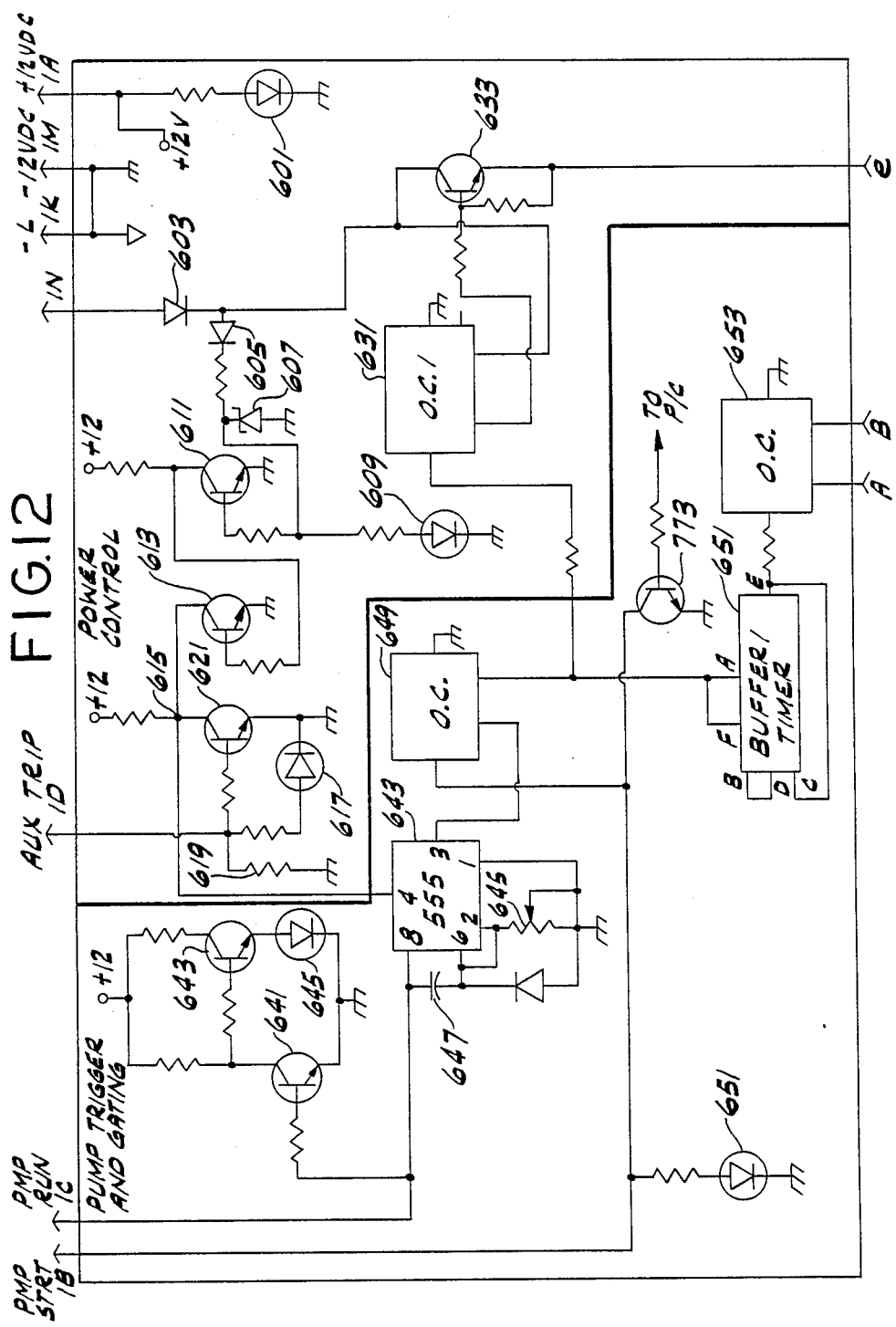

SWITCHING AND TESTING SYSTEM

BACKGROUND OF THE INVENTION

This invention relates to a switching system to power an electric load from a voltage supply. More particularly, for example, the present invention relates to an electronic switch control system for a mine vehicle having controls for selectively connecting the electric motors thereof to a power supply. This invention also relates to an electronic testing system for indicating and locating failures which may occur in an electronic switching system.

For mine vehicle control it is generally known that contactor type systems are used due to their reliability and ease of replacement in a hostile environment. These contactor type systems have been used for controlling both the rotational direction and speed of the motors of mine vehicles. For example, tram motors on the mine vehicle may be connected in series, dividing a 300 volts DC line voltage equally between two tram motors (150 volts DC each). Because the motors are rated for 300 volt line voltage, this reduction in voltage causes the motors to turn at half their normal speed (low tram). A transition to the high speed is accomplished by connecting the motors in a parallel configuration, rather than a series configuration, through use of mechanical interlocks and additional contacts. In parallel the motors are now at 300 volts DC and turn at a higher rate of speed (high tram). Such a contactor controller system is susceptible to contact failure which results in high maintenance cost as well as delays in production during down time. An arc is produced when the contacts are switched, thus producing ozone gas which causes deterioration of wiring, electrical terminations and mechanical components.

One presently available system has reduced the number of switching contacts by utilizing Silicon Controlled Rectifiers (SCRs). This system also has an electronic switching system that varies the effective motor voltage by controlling a series of line voltage pulses. Such a system has some drawbacks. Since the system produces pulses, it is more complex and trouble shooting of the circuits is difficult and time consuming. The training requirements for understanding and trouble shooting the system are greater than for the contactor system. Because of the complexity and greater training requirements, the diagnosing of a failure is a significant maintenance cost. Additional dollar losses occur during the downtime of the mine vehicle since it is not available for production.

As with all SCRs, once triggered into conduction, they remain on until the current flowing through the device is interrupted. Thus, in the presently available SCR systems, which vary the effective motor voltage by controlling the line voltage pulses, during each pulse cycle the SCR must have the current flow interrupted. Circuitry which will provide such interruption of current flow is complex and involves the solution of substantial design problems. Troubleshooting of numerous circuit components is difficult and time consuming. The circuit components are expensive to replace and because of the circuit complexity require extensive training to acquire an understanding of the system sufficient to service it.

SUMMARY OF THE INVENTION

Among the several objects of the present invention may be noted the provision of a switch control system for controlling the switches used for powering an electrical load; the provision of such a control system which utilizes electronic components; the provision of such a control system which reduces the number of contactors; the provision of such a control system which is simpler and easier to troubleshoot; the provision of such a control system that requires less training time to understand and service; the provision of such a system that uses on-board diagnostics for troubleshooting; and the provision of such a control system which is economical and reliable.

Briefly, a switching system of this invention powers first and second electrical loads from a voltage supply, the electrical loads being operable from controls and adapted to be connected to the voltage supply by the switching system. The switching system includes switching circuitry having a control element which is responsive to a control voltage difference to cause the switching circuitry to become conductive, the switching circuitry having a switch terminal connected to a first supply line and another switch terminal connected to the first electrical load. The switching system also includes additional circuitry responsive to the controls for generating the control voltage difference when the voltage supply is connected to the first supply line thereby powering the first electrical load from the first supply line. The switching system further includes further circuitry responsive to the controls for generating first and second control signals. Also included in the switching system is a contactor responsive to the second control signal for connecting the voltage supply to a second supply line, the second electrical load connected to the second supply line and another contactor responsive to the first control signal for connecting the second supply line to the first supply line thereby connecting the voltage supply to the first supply line and for disconnecting the second supply line from the first supply line to interrupt power through the switching circuitry thereby discontinuing the supply of power to the first electrical load.

In another aspect of the invention an electronic switch control system is provided for use with a plurality of electronic switches to power an electrical load from a voltage supply, the electrical load being operable from controls. The supply has a voltage connection relative to a common and the electrical load is adapted to be connected to the voltage connection by a first one of the electronic switches and to the common by a second one of the electronic switches. The electronic switches have a control element and are responsive to respective control voltage differences between the control element and a reference terminal. The electronic switch control system includes circuitry for generating an electrical signal in response to one of the controls. The electronic switch control system also includes first circuitry responsive to the electrical signal for producing the control voltage difference to switch the first one of the electronic switches thereby connecting the electrical load to the voltage connection. The electronic switch system further includes second circuitry responsive to the electrical signal for producing the control voltage difference to switch the second one of the electronic switches thereby connecting the electrical load to the common. The first and second circuitry are separate and independent from each other but being identical to each other whereby the number of replacement parts required is reduced and the servicing of the control system is simplified.

In still another aspect of this invention an electronic switch control system is provided for use with a plurality of electronic switches to power electrical loads from a voltage supply, the electrical loads being operable from controls. A first one of the electrical loads is adapted to be connected to the voltage supply by a first one of the electronic switches and a second one of the electrical loads is adapted to be connected to the voltage supply by a second one of the electronic switches. The electronic switches have a control element and are responsive to respective control voltage differences between the control element and a reference terminal. The electronic switch control system includes circuitry for generating a first electrical signal in response to one of the controls. The electronic switch control system also includes first circuitry responsive to the first electrical signal for producing the control voltage difference to switch the first one of the electronic switches thereby connecting the first electrical load to the voltage supply. The electronic switch control system further includes other circuitry for generating a second electrical signal in response to another one of the controls. The electronic switch control system additionally includes second circuitry responsive to the second electrical signal for producing the control voltage difference to switch the second one of the electronic switches thereby connecting the second electrical load to the voltage supply. The first and second producing circuitry are separate and independent from each other but are identical to each other whereby the number of replacement parts required is reduced and the servicing of the control system is simplified.

In a further aspect of the invention an electronic switching system powers an electrical load from a voltage supply, the electrical load being operable from controls and adapted to be connected to the voltage supply by the electronic switching system. The electronic switching system includes resistance means having a power rating which if exceeded for more than a predetermined time will cause burnout thereof. The electronic switch system also includes circuitry responsive to the controls for connecting the voltage supply to the resistance means thereby to produce an electrical signal. The electronic switch system further includes electronic switch circuitry having a control element which is responsive to a control voltage difference between the element and a reference terminal to cause said switch circuitry to become conductive thereby connecting the electrical load to the voltage supply. The electronic switch circuitry is subject to a failure in which the switch circuitry will not become conductive even when the control voltage difference is applied. And the electronic switch system includes circuitry connected to the resistance means for producing the control voltage difference in response to the electrical signal whereupon if the electronic switch circuitry becomes conductive in less than the predetermined time, the resistance means does not burn out and the electrical load is connected to the voltage supply, but if the electronic switch circuitry fails to become conductive during the predetermined time period the resistance means burns out thereby providing a visible indication and a characteristic smell for easily identifying the failure of the electronic switch circuitry.

In yet another aspect of the invention an electronic testing system is provided for use with an electronic switching system responsive to a control signal for connecting an electric load to a voltage supply, the electrical load being operable from controls. The electronic testing system includes an electronic circuit responsive to the controls for producing the control signal and having means responsive to the controls only when the electronic circuit is in a test mode for indicating a failure in either the electronic circuit or the electronic switching system. The electronic testing system also includes circuitry connected to the electronic circuit, normally for cable-connection to transmit the control signal to the electronic switching system, and adapted for quick disconnection from the electronic switching system. The electronic testing system further includes test circuitry adapted for quick connection to the cable-connection circuitry whereupon when the electrical load does not properly operate, the cable-connection circuitry is disconnected from the electronic switching system and the test circuitry is connected to the cable-connection circuitry to place the electronic circuit in the test mode thereby when one of the controls is operated, the failure is identified by the indicating means as either being in the electronic circuit or in the electronic switching system.

Other objects and features will be in part apparent and in part pointed out hereinafter.

BRIEF DESCRIPTION OF THE DRAWINGS

FIG. 4A is a schematic of SCR Modules and motors of the mine vehicle utilized in the present invention;

FIG. 4B is a schematic of the control coils of the main contactor (M1) and of the tram/conveyor contactor (TC);

FIG. 7 is a schematic of the SCR Module shown in FIG. 4;

FIG. 8 is a circuit board showing burnout resistors of the SCR Modules with one burned out;

FIG. 10 is a schematic of an SCR optical coupler utilized in the Logic Unit;

FIG. 11 is a schematic of a transistor optical coupler utilized in the Logic Unit;

FIG. 12 is a schematic of Pump and Trigger Gating and Power Control the Logic Unit;

Corresponding reference characters indicate corresponding parts throughout the several views of the drawings.

DETAILED DESCRIPTION OF A PREFERRED EMBODIMENT

Figure 1:
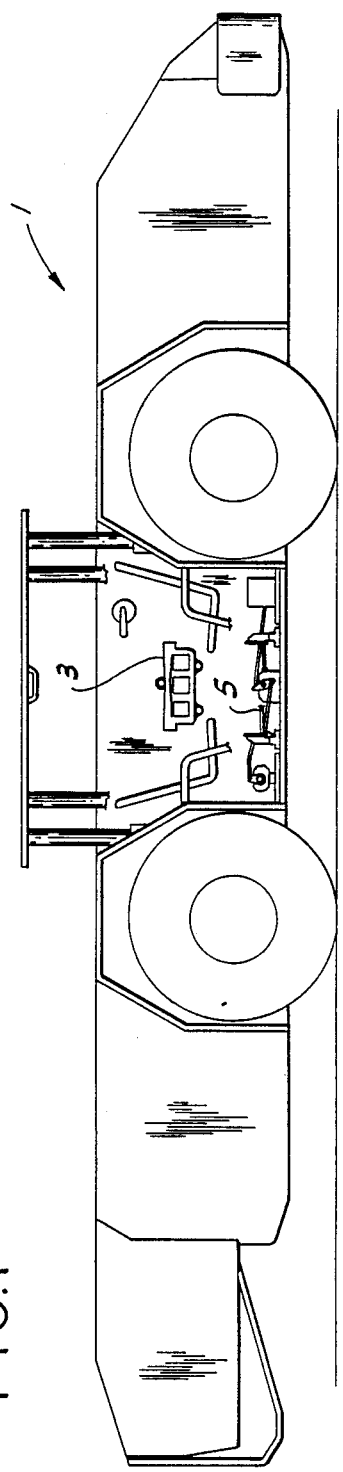
FIG. 1 is an elevation of one side of a mine vehicle or car and associated car controls with which the present invention is used.

In FIG. 1 a mine vehicle 1 has car controls including hand-operated controls 3 and foot operated controls 5. Vehicle 1 is used in mining operations and includes a conveyor and storage area for transporting mined material such as coal out of a mine. The hand controls 3 and foot-operated controls 5 include a "panic" switch, pump switch, conveyor interrupt, conveyor switch, forward tram, reverse tram and high tram. Also included in the controls is a conveyor reversing switch discussed with respect to FIG. 4A. The controls operate the several motors which perform the several functions provided by the mine vehicle. These include a pump motor (used for hydraulics on the vehicle), a conveyor motor (used to load and unload mined material) and left and right tram motors (used for moving the vehicle both in the forward and reverse directions).

Figure 2:
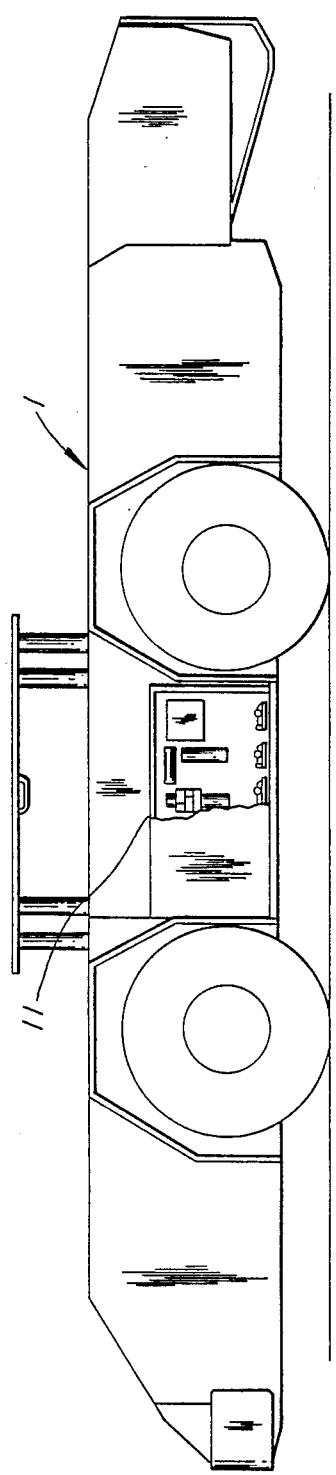
FIG. 2 is an elevation of the other side of the mine vehicle of FIG. 1 with parts broken away to show one embodiment of the present invention mounted thereon.

The other side of the mine vehicle 1 is shown in FIG. 2. A portion of an enclosure 11 is shown broken away exposing circuit components of the present invention used for controlling the pump, conveyor and tram motors.

Figure 3:
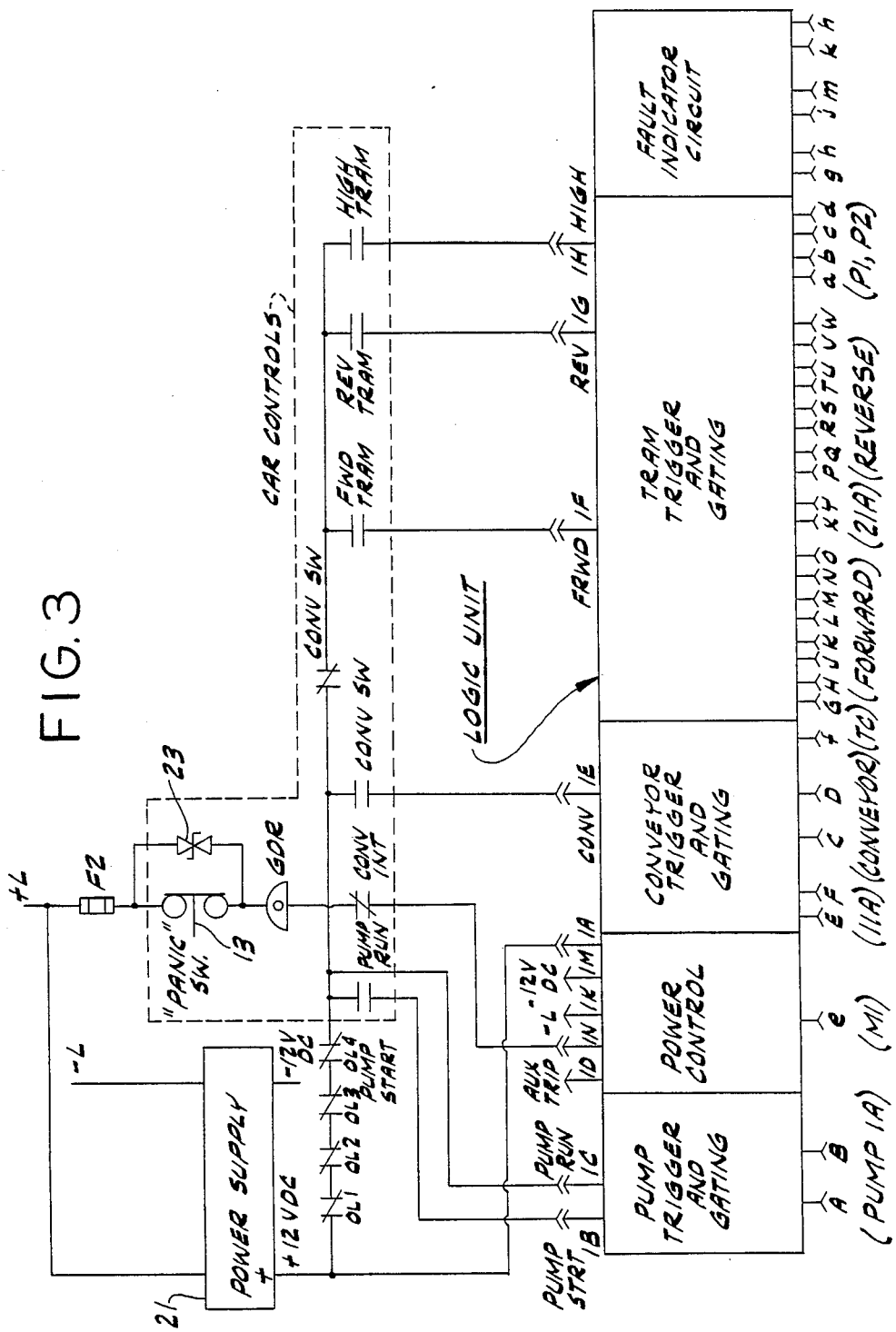
FIG. 3 diagram of the car controls shown in FIG. 1 including a Logic Unit and power supply.

As shown in FIG. 3, power is supplied through +L and −L which may be a high voltage of 300 volts DC. The positive side +L is connected to a fuse F2. A "panic" switch 13, one of the car controls, is normally closed and is used in an emergency to manually interrupt power to the motors. A metal oxide varistor 23 is connected in parallel with the panic switch. A mercury tube grounding diode relay GDR (normally closed contact) will automatically operate to interrupt power should a ground fault occur.

The +L and −L are connected to a power supply 21 which provides +12 VDC and −12 VDC. The +12 VDC is connected to four normally-closed overload contactors OL1, OL2, OL3 and OL4. The control coils for these overload contactors are connected to corresponding motors—pump, conveyor, left tram and right tram (see FIG. 4A).

The remaining car controls shown in FIG. 3 are used to control several contactors—pump (PUMP), conveyor interrupt (CONV INT), conveyor on switch (CONV SW) (both front and back contacts), forward tram (FWD TRAM), reverse tram (REV TRAM) and high tram (HIGH TRAM). Each of these controls provides an input to the Logic Unit. In addition a connection is provided to one terminal of the series-connected overload contactors, the −L voltage and the −12 Volts DC from the power supply. An auxiliary trip (AUX TRIP) may be connected to an auxiliary contact.

The Logic Unit includes several circuits utilized to control the various functions. A Pump Trigger and Gating circuit controls the pump motor, a Power Control circuitry controls the main contactor M1. Conveyor Trigger and Gating circuitry controls the conveyor motor and the TC contactor and the Tram Trigger and Gating circuitry controls the tram motors. A Fault Indicator circuit is also included and is further discussed with respect to FIGS. 5B and 6.

Figures 5A, 5B:
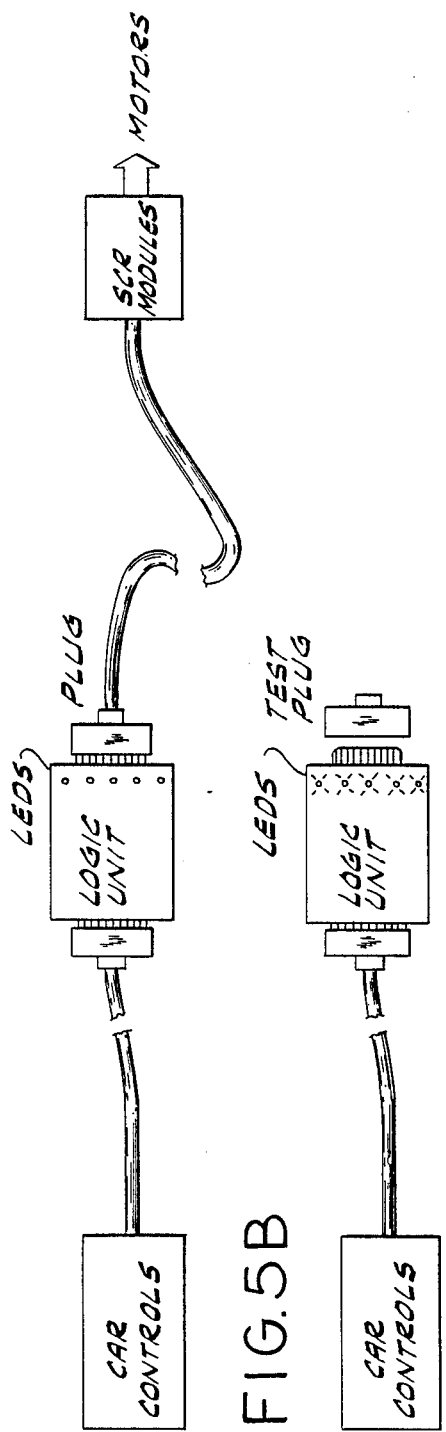
FIG. 5A is an overview diagram showing interconnection of the car controls, Logic Unit, plug, SCR Modules and motors.
FIG. 5B is an overview diagram showing connection of a test plug in place of the plug in FIG. 5A.

The Logic Unit has outputs A-H, J-Y, a-h, j-k and m-n. Each of these outputs (except for g-h, j-k and m-n) is plug and cable connected to identically marked terminals in FIGS. 4A and 4B. Such plug connection is illustrated in FIG. 5A.

Outputs e and f each produce an optically isolated voltage output utilizing the +L or 300 v DC supply. Outputs A-H, J-Y and a-d provide optically isolated pairs. Each pair is controlled between a connected or disconnected current path. These outputs will be discussed in detail with regard to FIGS. 10–13.

In FIG. 4A the positive voltage +L and negative voltage −L power the motors. The M1 contactor controlled by the control coil which is connected to the e output of the Logic Unit (FIG. 4B). The M1 contactor when closed supplies power to a first supply line 41. Line 41 is connected to one terminal of the control coil 43 of OL1. A second terminal of coil 43, is connected to the anode or a switch terminal of an SCR Module 45. Each SCR Module is schematically represented similarly to SCR Module 45. The SCR included in each SCR Module has control terminals similar to those connected to A and B for module 45. The SCR Modules will be discussed in more detail with respect to FIG. 7.

The Pump Motor (Pump Arm & Series Field) is connected to the cathode or a second switch terminal of SCR Module 45. A surge-reducing resistor 46 is placed in parallel with module 45. The Series Field of the Pump Motor has a connection to a common line 49 which connects to the anode of a diode 47. The cathode of diode 47 is connected to negative line −L. The shunt field of the Pump Motor is connected between the anode of SCR Module 45 and line 49.

The control coil of the tram/conveyor contactor TC is connected to the f output of the Logic Unit (FIG. 4B). The TC contactor, when closed, connects line 41 to another supply line 61. Line 61 is connected to one terminal of each of control coils 63, 83 and 103 respectively of OL2, OL3 and OL4.

Coil 63 is also connected to anode terminal of SCR Module 65. The cathode of Module 65 is connected to the anode of Module 67 and a terminal of surge reducing resistor 69. The other terminal of resistor 69 and the cathode of Module 67 is connected to a conveyor reversing switch CONV REV SWITCH. A second terminal of the conveyor reversing switch is connected to the series field of the conveyor motor. The series field is also connected to the line 49. The conveyor armature CONV ARM and interpole are series connected and also connected to the conveyor reversing switch which has contacts 71, 73, 75 and 77 for reversing the connections to the conveyor armature and interpole. The conveyor reversing switch is switched by controls in the vehicle. Thus when contacts 71 and 75 are closed and contacts 73 and 77 are open, one terminal of the conveyer armature is connected to the cathode of Module 67 and the interpole is connected to one terminal of the series field. Conversely, when contacts 71 and 75 are open and contacts 73 and 77 are closed, the interpole is connected to the cathode of module 67 and the conveyor armature is connected to the one terminal of the series field.

Another terminal of the coil 83 is connected to a group of four SCR Modules 85, 87, 89 and 91 used to control connections to the left tram motor Armature LT ARM and LT interpole. Modules 85 and 89 are series-connected between the other terminal of coil 83 and one terminal of the LT series field of the left tram motor. Similarly Modules 87 and 91 are series-connected between the other terminal of coil 83 and the one terminal of the LT series field. One terminal of the interpole of the left tram motor is connected to the node at the cathode of Module 85 and anode of Module 89. One terminal of the left armature is connected to the node at the cathode of Module 87 and the anode of Module 91. Another terminal of the LT series field is connected to node 93. An SCR Module 95 has its anode connected to node 93 and its cathode connected to common line 49.

Another terminal of the coil 103 is connected to the anode of SCR Module 105. The cathode of Module 105 is connected to node or junction 107 and to a group of four SCR Modules 109, 111, 113 and 115 used to control the energization to the right tram motor Armature RT ARM and RT interpole. These Modules are arranged in a fashion similar to that of the four Modules 85, 87, 89 and 91. For brevity, this is not described in detail and it will be easily appreciated that the Right Tram Armature, RT interpole and RT Series Field are interconnected similarly to the corresponding Left Tram components. One of the terminals of the RT Series Field is connected to the common line 49.

The anode of SCR Module 121 and one terminal of a surge-reducing resistor 123 are connected between nodes or junctions 93 and 107. The cathode of SCR module 121 and another terminal of resistor 123 are connected to the anode of diode 125. The cathode of diode 125 is in turn connected to node 107.

A flywheel diode 131 has its anode connected to common line 49 and its cathode connected to supply line 61.

Vehicle 1 operates as follows when in an operating or normal mode. The car controls, Logic Unit, plug, SCR Modules and motors are connected as shown in FIG. 5A. The normally closed CONV INT contact supplies power at 1N to the Power Control circuitry (FIG. 3). If there is +12 VDC at the PMP RUN input 1C for a predetermined period (discussed in detail with respect to FIG. 12), then when the Pump Start contact is manually closed by the operator, an input signal appears at 1B of the Pump Trigger and Gating Circuit and an output signal appears at e to close the M1 contactor and supply power to line 41 (FIG. 4A). The pump motor will turn on since there is a conduction path through resistor 46. As a result of the closing of the M1 contactor, a predetermined time period later (as will be discussed in detail with respect to FIG. 12) a conduction path is closed between A and B by the Logic Unit and the SCR Module 45 will thus conduct and the pump motor will no longer be supplied through the resistor 46.

The operator may then use the car controls to operate the conveyor motor or the tram motors. Interlocks are built into the Logic Unit to prevent simultaneous operation of the conveyor and the tram motors.

The following Table I summarizes the operator requests and the Logic Unit Inputs and Outputs.

TABLE I

| OPERATOR REQUEST | LOGIC UNIT INPUT | OUTPUT (in sequence of occurrence) |
| --- | --- | --- |
| Conveyor | 1E | f, delay, C & D, delay, E & F |
| Low Tram Forward | 1F | f, delay, G & H, J & K, L & M, N & O, delay, X & Y |
| Low Tram Reverse | 1G | f, delay, P & Q, R & S, T & U, V & W, delay, X & Y |
| Hi Tram Forward | 1F, 1H | All low tram, delay, a & b, c & d |
| Hi Tram Reverse | 1G, 1H | All low tram, delay, a & b, c & d |

The outputs cause the appropriate SCR Modules to go into conduction. For example, the outputs for Low Tram Forward will cause the tram motors to be connected in a series arrangement across the +L to −L lines and thus operate at half their normal rotational speed. While the outputs for High Tram will cause both the left and right tram motors to each be connected across the entire +L to −L potential and thus operate at their full or normal rotational speed.

It will be appreciated that the outputs of the Logic Unit must be properly sequenced. Thus the delays permit the motors to be started with the surge-reducing resistor in place. Also, if High Tram operation is initiated, the motors start in Low Tram and then proceed to High Tram.

The Logic Unit including outputs e and f constitutes means responsive to the controls for generating first and second control signals. The Logic Unit including for example outputs E and F is an example of means for generating an electrical signal in response to one of the controls. And the Logic Unit including for example outputs C and D is an example of another means for generating an electrical signal in response to one of the controls.

Figure 6:
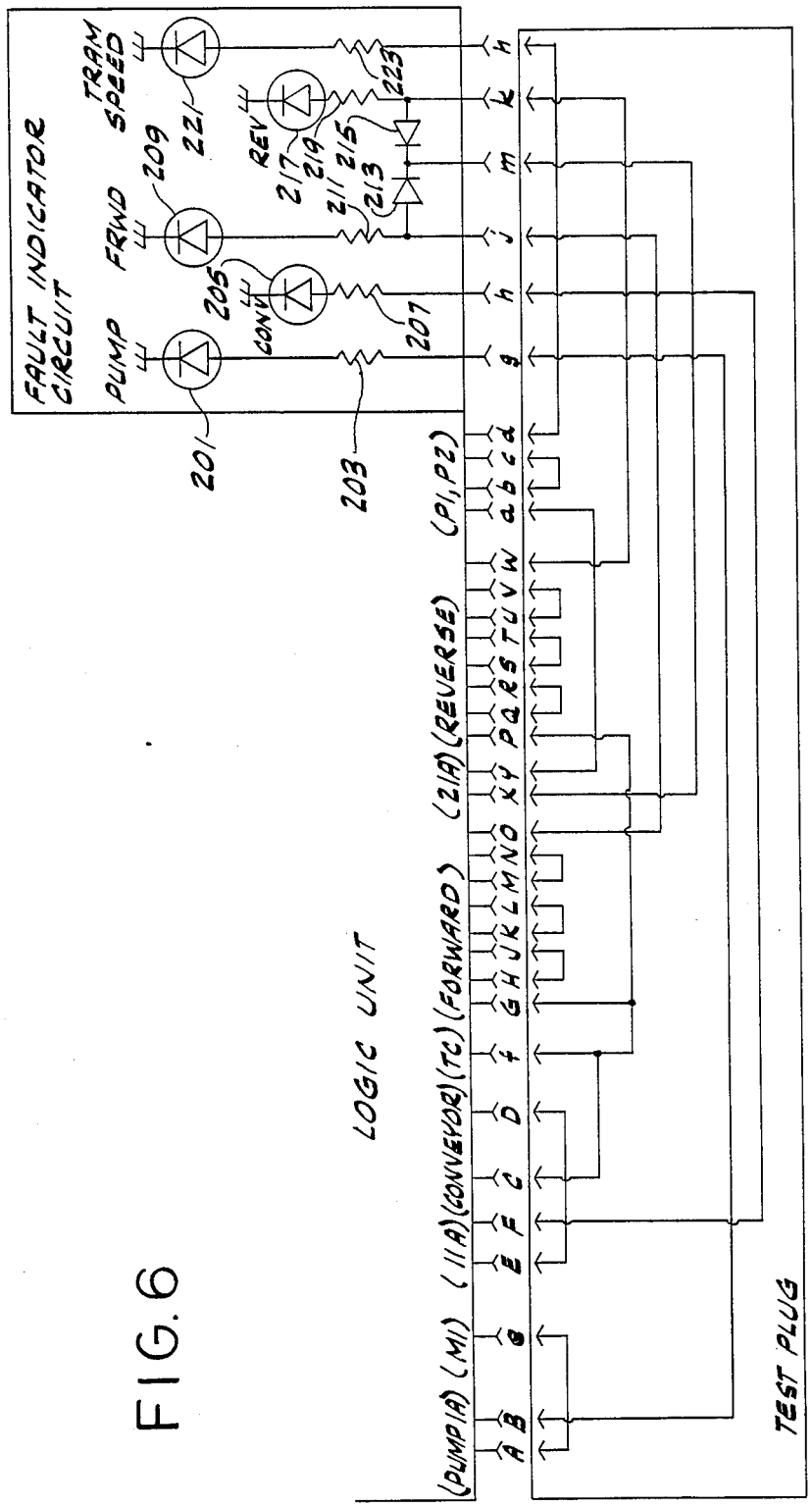
FIG. 6 is a schematic of the test plug for connection to the Logic Unit to utilize a fault indicator circuit included in the Logic Unit.

The vehicle 1 may also be operated in a test mode. In the test mode the normal cable-connection (FIG. 5A) using the plug between the Logic Unit and SCR Modules is disconnected. By so disconnecting there is no chance of accidental operation of any of the motors. The Test Plug is inserted into a receptacle in the Logic Unit as shown in FIG. 5B. The Test Plug as shown in FIG. 6 provides jumpers between the various outputs of the Logic Unit including the Fault Indicator Circuit. When the Test Plug is inserted the car controls are operated as described above. For example, when the pump start switch is actuated, a voltage should appear at output e and a current path be made between A and B. Thus if the Pump Trigger and Gating circuitry and the Power Control circuitry is operating correctly, a voltage will appear at g and cause the light emitting diode LED 201 to light. A resistor 203 is connected in series with LED 201 to limit the current to the LED. Thus, when the LED lights up in the test mode, this is a positive indication that the Logic Unit circuitry is operating properly. The LED's failure to light in the test mode indicates that there is a problem or fault in the corresponding circuitry. LED's 205, 209, 217 and 221 operate analogously using power from the output f for determining and isolating failures in the Conveyor Trigger and Gating circuitry and the Tram Trigger and Gating circuitry. It will be noted that current limiting resistors 207, 211, 219 and 223 are used for these LEDs. Additionally diodes 213 and 215 are used to isolate the Forward and Reverse testing while providing a voltage at m if either the Forward or Reverse Logic Unit circuitry is operating. The voltage appearing at m is then used for testing of the High tram circuitry.

In this way the Logic Unit including the Fault Indicator Circuit is an example of an electronic circuit responsive to the controls for producing a control signal and having means responsive to the controls only when the electronic circuit is in a test mode for indicating a failure in either the electronic circuit or the electronic switching system.

The receptacle in the Logic Unit is thus an example of means connected to the electronic circuit normally for cable-connection to transmit the control signal to the electronic switching system and adapted for quick disconnection from the electronic switching system.

And the Test Plug constitutes test means adapted for quick connection to the cable-connection means, whereupon when the electrical load does not properly operate, the cable-connection means is disconnected from the electronic switching system and the test means is connected to the cable-connection means to place the electronic circuit in the test mode thereby when one of the controls is operated, the failure is identified by the indicating means as either being in the electronic circuit or in the electronic switching system.

Each of the SCR Modules shown in FIG. 4A is schematically identical. In FIG. 7 the schematic of the SCR module shows an anode or switch terminal 301 and cathode or switch terminal 303 of an SCR 305. Input terminals 307 and 309 correspond respectively, for example, to a and b of module 105. A suppression capacitor 321 and resistor 323 are series-connected between terminals 301 and 303. Thus when the TC contact is closed (M1 contact for module 45) each of capacitors 321 will charge since there is path between +L and −L (see FIG. 4A). The cathode of a zener diode 325 is connected to input terminal 309. One terminal of a burn-out resistor 327 is connected in series to the anode of diode 325 and the other terminal is connected to a node 329. Node 329 is connected to the cathode of another zener diode 331 and to one terminal of a resistor 333. The anode of diode 331 is connected to terminal 303. Another terminal of resistor 333 is connected to the gate terminal of SCR 305. A capacitor 335 and resistor 337 connected in parallel between the gate terminal and terminal 303.

The operation of the SCR Module is now described. Each capacitor 321 will initially charge from the +L and −L supply. The Logic Unit outputs, when activated according to Table I, provide a current path between terminal 307 and 309. Instantaneously the charge on capacitor 321 will produce a current through diode 325, resistor 327 and diode 331. A voltage potential is thus produced across diode 331 causing current to flow through resistor 333 into the gate terminal. The SCR 305, if operating properly, will then go into a highly conductive state and the current through burnout resistor 327 will cease. If, however, the SCR has failed "off", i.e., will not go to the highly conductive state, current will continue to flow through resistor 327. The values of the components of the circuit shown in FIG. 7 are chosen so that the current flow through resistor 327 exceeds the power rating. If this power rating is exceeded for more than a predetermined time period the resistor 327 will burn out.

As shown in FIG. 8 several SCR Modules 85, 87 and 89 each have a resistor 327 mounted thereon. For Modules 85 and 89 the resistor 327 is not burned out which indicates that the corresponding SCR 305 has not failed off. However, for SCR module 87 the resistor 327 has burned out thus providing both a visual indication and a characteristic smell of the failure.

One example of the values and ratings chosen for the circuit of FIG. 7 is:

| Capacitor 321 | .22 uf |
| Resistor 323 | 375 ohms |
| Diode 325 | 3.3 v Zener |
| Resistor 327 | 270 ohms, 5 watts |
| Diode 331 | 3.3 v. Zener |
| Resistor 333 | 10 ohms, 1 watt |
| Capacitor 335 | .01 uf |
| Resistor 337 | 270 ohms, 1 watt |

As will be readily appreciated by the skilled worker these values and ratings may be varied to accommodate different burnout currents and times.

Resistor 327 is an example of resistance means having a power rating which if exceeded for more than a predetermined time will cause burnout thereof. Contactors M and TC constitute means responsive to the controls for connecting the voltage supply to the resistance means thereby to produce an electrical signal.

In this way SCR 305 is an example of electronic switch means having a control element which is responsive to a control voltage difference to cause said switch means to become conductive, said switch means having a switch terminal connected to a first supply line and another switch terminal connected to an electrical load. The SCR 305 is also an example of electronic switch means having a control element which is responsive to a control voltage difference between the element and a reference terminal to cause said switch means to become conductive thereby connecting an electrical load to the voltage supply, the electronic switch means being subject to a failure in which the switch means will not become conductive even when the control voltage difference is applied.

SCR Module 85 constitutes an example of means responsive to the electrical signal for producing the control voltage difference to switch a first one of the electronic switches thereby connecting the electrical load to the voltage connection. And SCR Module 91 is an example of another means responsive to the electrical signal for producing the control voltage difference to switch a second one of the electronic switches thereby connecting the electrical load to the common; the first named and the other producing means being separate and independent from each other but being identical to each other whereby the number of replacement parts required is reduced and the servicing of the control system is simplified.

SCR Module 109 is an example of a further means responsive to another electrical signal for producing the control voltage difference to switch a third one of the electronic switches thereby connecting a second electrical load to the voltage supply; said first above named and the further producing means being separate and independent from each other but being identical to each other whereby the number of replacement parts required is reduced and the servicing of the control system is simplified.

The zener diode 325, resistor 327, zener diode 331, resistor 333 capacitor 335 and resistor 337 thus constitute means 324 responsive to the controls for generating a control voltage difference when the voltage supply is connected to a supply line thereby powering an electrical load from the supply line. Additionally zener diode 325, resistor 327, zener diode 331, resistor 333, capacitor 335 and resistor 337 are an example of means connected to a resistance means for producing the control voltage difference in response to an electrical signal whereupon if the electronic switch means becomes conductive in less than the predetermined time, the resistance means does not burn out and the electrical load is connected to the voltage supply, but if the electronic switch means fails to become conductive during the predetermined time period the resistance means burns out thereby providing a visible indication and a characteristic smell for easily identifying the failure of the electronic switch means.

Figure 9:
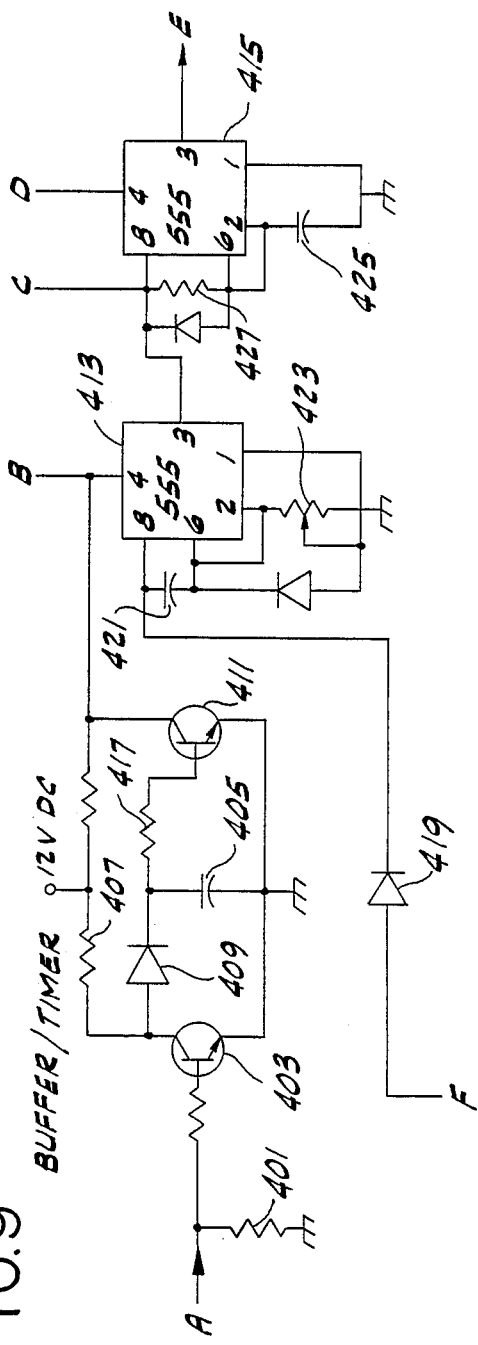
FIG. 9 is a schematic of a Buffer/Timer circuit utilized in the Logic Unit.

In FIG. 9 is shown a Buffer/Timer circuit repeatedly used in the Logic Unit. The Buffer/Timer has five terminals A-F. To avoid confusion with similar labels in other drawing figures, the labels A-F appear immediately adjacent the Buffer/Timer circuit. An input terminal A has a pull down resistor 401 connected to ground. Transistor 403 is thus off when terminal A is at a logical low or ground. With transistor 403 off, the 12 v DC supply will charge the capacitor 405 through resistor 407 and diode 409. With capacitor 405 charged, transistor 411 will be in an on or conducting state and will hold its collector output near ground. Thus, terminal B which is connected to reset pin 4 of timer 413, which is a type 555, is held at a logical low. As long as low is present on pin 4, output pin 3 will remain at a logical low. Terminal C will thus be low and power pin 8 of timer 415 will remain off. Thus output pin 3 of timer 413 will be low.

Should the input terminal A be set to a logical high, transistor 403 will be turned on and the capacitor 405 will no longer charge through diode 409. The capacitor 405 will begin to discharge through resistor 417 and the base-emitter junction of transistor 411. When the capacitor 405 has discharged sufficiently, the transistor 411 will eventually turn off and terminal B will go to a logical high, i.e., reset pin 4 of timer 413 will go high. Thus, the collector of transistor 411 will not go high until the terminal A has remained high for a sufficient time and the input at terminal A is thus buffered.

Supply power is provided to power pin 8 of timer 413 at terminal F. In most of the Buffer/Timer's uses in the Logic Unit, terminals A and F are connected so that power is provided from the logical high input at terminal A. However, as will be readily appreciated power may be supplied from an input terminal A of a second Buffer/Timer circuit.

When power is supplied at power pin 8 of timer 413 through diode 419, timer 413 becomes operational. Instantaneously, a capacitor 421 will begin to charge through variable resistor 423 and threshold pin 6 and trigger pin 2 of timer 413 will be set high. The output pin 3 of timer 413 will remain low until the capacitor 421 charges sufficiently at which time pin 2 will go low. The output pin 3 of timer 413 will then go high causing terminal C and power pin 8 of timer 415 to go to a logical high. As can be easily appreciated, the time period from the appearance of a logical high on pin 8 of timer 413 until output pin 3 may be varied by adjusting the values of capacitor 421 and resistor 423.

When pin 8 of timer 415 goes high, capacitor 425 will begin charging through resistor 427. Threshold pin 6 and trigger pin 2 of timer 415 will be at a logical low and thus output pin 3 of timer 415 and terminal E will immediately go high. Terminal E will remain high for another time period until capacitor 425 has charged sufficiently to change trigger pin 2 to a logical high at which time terminal E will go low. This other time period depends on the values chosen for capacitor 425 and resistor 427. Capacitor 425 was chosen to be 3.3 uf and resistor 427 was chosen to be 0-1 Megaohm. This produces approximately a 5 second time period for a pulse output at terminal E.

As can be readily appreciated terminals B, C, D and E may be interconnected to produce various results If terminals C and D are connected together, the timer immediately resets when pin 8 of timer 415 goes high. Alternatively, terminals B and D and terminals C and E may be connected. The timer 415 is thus effectively bypassed and output terminal E will remain high as long as power pin 8 of timer 415 remains high.

FIGS. 10 and 11 show the optical couplers used in the Logic Unit for isolation purposes. In FIG. 10 is shown OC, which has inputs 501 and 503. When a positive voltage, i.e. a trigger signal, appears between input 501 and 503, light will be emitted by the diode and cause the corresponding light sensitive device to conduct. Thus, there is a conducting path from terminal 505 to terminal 507. The output terminals 505 and 507 when connected to the input of the SCR Modules in FIG. 4A, will cause the Module to trigger.

In FIG. 11 is shown another optical coupler OC1. When a positive voltage (trigger signal) appears between terminals 511 and 513, light will be emitted by the diode and cause the corresponding phototransistor to conduct. There will be a conducting path established between the collector and emitter of the phototransistor, i.e., a conducting path from terminal 515 to 517. As used in the Logic Unit, the base of the phototransistor, terminal 519, is not connected. The output terminals 515 and 517 are connected in the Logic Unit to other circuitry to produce a voltage to drive the control coils of M1 and TC.

Figure 13:
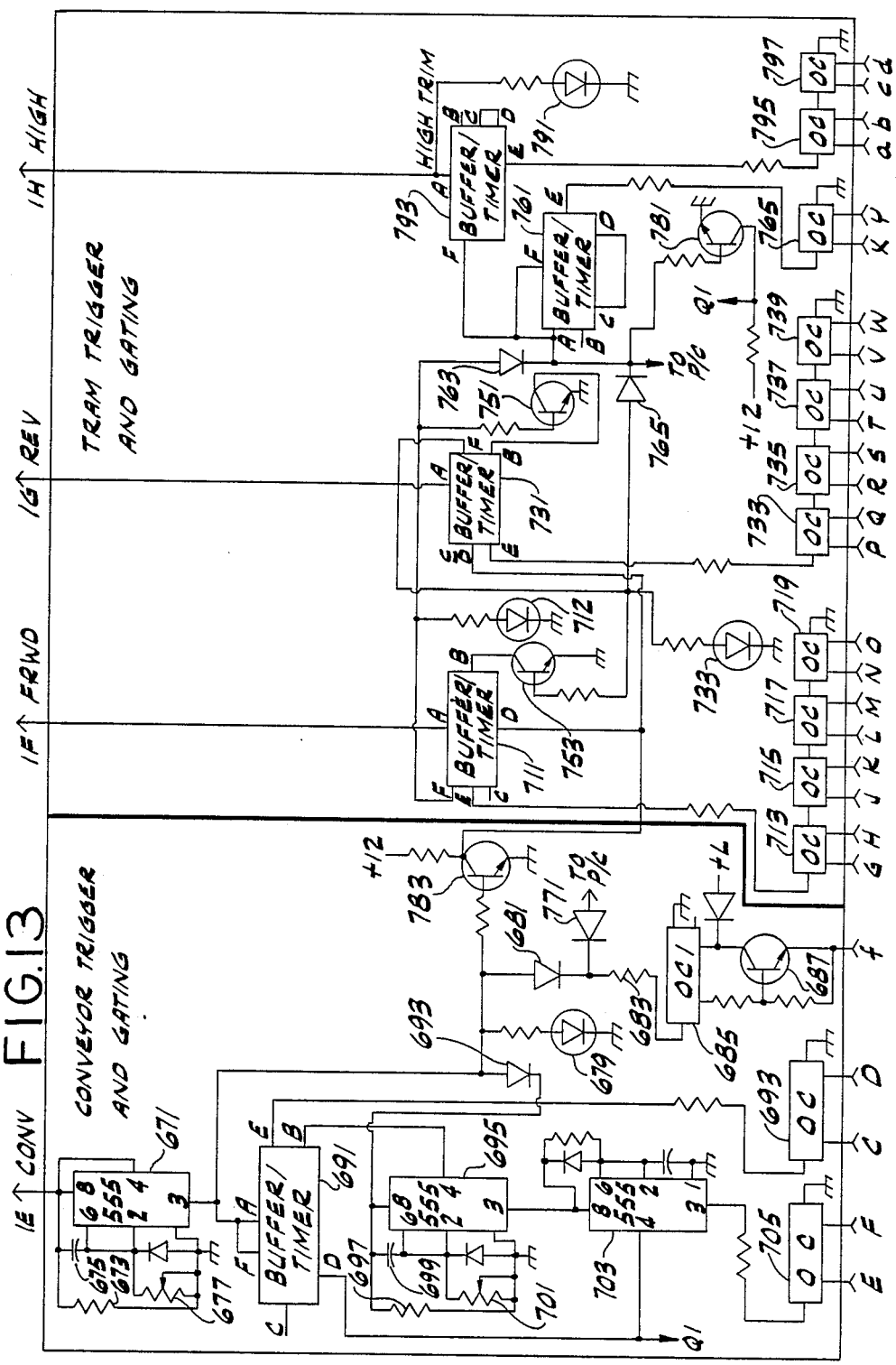
FIG. 13 is a schematic of Conveyor Trigger and Gating and Tram Trigger and Gating of the Logic Unit.

For convenience the terminals of OC and OC1 are oriented in FIGS. 12 and 13 in the same manner as shown in FIGS. 10 and 11.

The Power Control circuit shown in FIG. 12 will now be described. The −L voltage reference is input at 1K and the −12 v DC reference is input at 1M. These voltage references are connected together and provide the common reference for the Logic Unit. The +12 v DC reference is input at 1A and is connected to an LED 601 which indicates whether the +12 v DC is supplied.

The +L voltage is supplied at input 1N. If the +L voltage is present, diodes 603 and 605 will be forward biased. A 12 volt zener diode 607 will maintain 12 volts and an LED 609 will light indicating the presence of high voltage +L. As long as the +L voltage is present transistor 611 will be on. Since the collector of transistor 613 will be near common, transistor 613 will be off and node 615 will be permitted to go to a logical high. If the +L voltage is not present timer node 615 will be a logical low.

The auxiliary trip contact (normally a logical low) is input at 1D. An LED 617 is used to monitor whether or not the AUX TRIP has been activated. A pull down resistor 619 holds a logical low at the base of transistor 621. Thus transistor 621 is off and node 615 will be permitted to go to a logical high. But if the AUX TRIP goes to a logical high, node 615 will go to a logical low.

The +L voltage is also connected to one of the output terminals of OC1 631. If OC1 is triggered on at its input (as will be described later), the +L voltage will cause transistor 633 to turn on and supply the high voltage +L at the output e. This will thus close the M1 contact.

The Pump Trigger and Gating circuit of FIG. 12 is now described. As long as none of the overload contacts OL1, OL2, OL3 and OL4 opens, +12 v DC will be supplied at PMP RUN input 1C. The logical high of 12 v DC will cause transistor 641 to be on. The base of another transistor 643 will thus be held near a logical low and cause transistor 643 to be off. LED 645 will thus be off as long as 12 v DC appears at input 1C. Should the −12 v DC disappear due to the operation of one of the overload contacts, the LED 645 will go on.

The input 1C is also connected to power pin 8 of a timer 643. Since timer 643 is connected to circuitry analogous to that of timer 413, the detailed operation will not be repeated here. Variable resistor 645 is a 0–1K ohm potentiometer and capacitor 647 is 0.1 microfarads. As can be readily appreciated, output pin 3 of timer 643 will go high only when power pin 8 has been energized for a sufficient time and reset pin 4 is at a logical high. The time period between a logical high at pin 8 of timer 643 and a logical high at output pin 3 is set to about 0.10 seconds. Reset pin 4 is connected to node 615 and thus it is required that there not be an AUX TRIP and the high voltage +L be supplied in order to make pin 3 of timer 643 go to a logical high.

Pin 3 of timer 643 is connected to an output of OC 649. The input of OC 649 will not be on unless a pump start signal appears at input 1B. When the pump start signal is received (i.e., the operator initiates the pump start contact as described above) an LED 651 will light and the input of OC 649 will be activated. If pin 3 of timer 643 is high, the output of OC 649 will go to a conducting state. A logical high will thus appear at the input of OC1 631. Additionally this logical high will be input at terminal A of Buffer/Timer 651. A timer in Buffer/Timer 651 analogous to timer 413 in FIG. 9 has a capacitor comparable to capacitor 421 of 2.7 microfarads and a variable resistor comparable to 423 of 0–1 Megaohm. The time period for Buffer/Timer 651 is set to approximately 1 second. Since terminal C and terminal E of Buffer/Timer 651 are connected, a logical high will continue at terminal E until there is no longer an input high at terminal A. When a logical high appears at terminal E of Buffer/Timer 651, OC 653 will be triggered into a conducting state and there will be a conduction path at outputs A and B.

As shown in FIG. 13 the input 1E connects to power pin 8 and reset pin 4 of timer 671. A pulldown resistor 673 holds these pins at a logical low. When a logical high is received at input 1E (i.e., the operator has operated the conveyor switch), the timer 671 is powered up and is reset. Since the timer 671 and associated circuitry is schematically similar to timer 413 and its associated circuitry, the detailed operation will not be repeated here. A capacitor 675 similar to capacitor 421 is 1 microfarad and a variable resistor 677 similar to variable resistor 423 is a 0–2 Megaohm potentiometer. The resistor 677 is set to produce a delay of approximately 0.5 second between a logical high received at pin 8 and a logical high output at pin 3. This time delay is used to prevent operation of the conveyor too soon after a forward or reverse tram.

Output pin 3 of timer 671 is connected to an indicating LED 679 which lights when pin 3 goes high. Pin 3 of timer 671 is also connected through diode 681 and resistor 683 to the input OC1 685. One of the output terminals of OC1 685 is connected to the high voltage +L. When the input of OC1 685 is activated, transistor 687 turns on and connects the high voltage +L to the output f to close the TC contact.

Pin 3 of timer 671 is also connected to input terminal A of Buffer/Timer 691. A timer in Buffer/Timer 691 analogous to timer 413 in FIG. 9 has a capacitor comparable to capacitor 421 of 1.2 microfarads and a variable resistor comparable to 423 of 0–1 Megaohm. The time period for Buffer/Timer 691 is set at approximately 1 second. When a logical high appears at output terminal E, OC 693 is activated and a conducting path is completed between C and D.

In this way the Logic Unit including outputs C and D is an example of means responsive to the controls for connecting the voltage supply to the resistance means (e.g. resistor 327) thereby to produce an electrical signal. And OC 693 is an example of isolating means having an output terminal and having an input terminal responsive to a trigger signal for producing a connection at the output terminal.

The output pin 3 of timer 671 is also connected through diode 693 to power pin 8 of timer 695. A pull down resistor 697 is connected to pin 8. The timer 695 and associated circuitry operate identically to timer 691 and its associated circuitry except that the reset pin 4 of timer 695 is connected to terminal B of Buffer/Timer 691. A capacitor 699 is 3.3 microfarads and a variable resistor 701 is a 0–2 Megaohm potentiometer. The timer 695 and associated circuitry is set to produce a delay of approximately 1 second between a logical high at pin 8 and a logical high appearing at output pin 3 of timer 695.

A power pin 8 of another timer 703 is connected to output pin 3 of timer 695. The timer 703 and associated circuitry is identical to the timer 415 and associated circuitry shown in FIG. 9 and a discussion of its operation will not be repeated here. Thus an approximately 5 second pulse is produced at output pin 3 after a logical high is received at pin 8 of timer 703. When the output pin 3 goes high, an OC 705 is activated and a conductive path is completed between outputs E and F.

The Tram Trigger and Gating circuit will now be described. When the operator requests a forward tram, a logical high will appear at input 1F. This logical high will also appear at terminal A of Buffer/Timer 711 and illuminate an LED 712. A timer in Buffer/Timer 711 analogous to timer 413 in FIG. 9 has a capacitor comparable to capacitor 421 of 1.2 microfarads and a variable resistor comparable to 423 of 0–1 Megaohm. The time period for Buffer/Timer 711 is set to approximately one second. When a pulse is output at terminal E of Buffer/Timer 711, OC's 713, 715, 717 and 717 are activated and conductive paths are made for G & H, J & K, L & M and N & O.

An operator request for a reverse tram operates similarly to that of the forward tram. When a logical high at input 1G, it will also appear at terminal A of Buffer/Timer 731 and illuminate an LED 733. Buffer/Timer 731 is identical to Buffer/Timer 711 and is also set for a time period of approximately one second. When a pulse is output at terminal E of Buffer/Timer 731, OC's 733, 735, 737 and 739 are activated and conductive paths are completed for P & Q, R & S, T & U and V & W.

An interlock is provided to prevent a simultaneous forward and reverse tram. When a logical high is input at 1F, a transistor 751 will be turned on. Terminal B of Buffer/Timer 731 will thus be held at a logical low and prevent the generation of a pulse at terminal E of Buffer/Timer 731. Analogously, when a logical high is input at 1G, a transistor 753 will be turned on. Terminal B of Buffer/Timer 711 will be held a logical low and prevent the generation of a pulse at terminal E of Buffer/Timer 711.

When either a high or low tram is requested, a logical high will be input at terminal A of Buffer/Timer 761 through diode 763 or diode 765. A timer in Buffer/Timer 761 analogous to timer 413 in FIG. 9 has a capacitor comparable to capacitor 421 of 1.5 microfarads and a variable resistor comparable to 423 of 0-2 Megaohm. The time period associated with Buffer/Timer 761 is set to approximately 2 seconds which is longer than that associated with both Buffer/Timer 711 and 731. A logical high pulse will be produced at terminal E of Buffer/Timer 761 and thus OC 765 will be triggered into a conduction state and there will be a conduction path at outputs X & Y.

In addition when either a high or low tram is requested, a logical high will be input to OC1 685 through diode 771. This will cause an output voltage at f as discussed above. It will be appreciated that the output at f will occur prior to any other outputs for forward or reverse tram or conveyor operation. It will also be appreciated that as soon as the conveyor and forward and reverse tram requests cease, i.e., inputs 1E, 1F and 1G are a logical low, the output f will immediately cease to have an output voltage. The TC contact is thus opened which interrupts all power to the SCR Modules connected to line 61 (FIG. 4A).

In addition when a high or low tram is requested, a logical high will cause a transistor 773 to be turned on (FIG. 12). This will prevent OC 649 from going to a conducting state and thus the M1 contact will remain open. For safety reasons, the pump motor must be started with the forward and reverse tram inputs in a logical low or off position.

Yet another safety feature is an interlock that prevents the tram and conveyor motors from being operated at the same time. When a high or low tram is requested, the logical high at terminal A of Buffer/Timer 761 will also cause transistor 781 to turn on. A logical low will thus appear at Q1. Both terminal D of Buffer/Timer 691 and reset pin 4 of timer 703 will be held low. Thus, OC 705 and OC 693 will be prevented from going to the conducting state. Analogously, when a logical high appears at output pin 3 of timer 671, transistor 783 will go to an on state. A logical low will thus appear at terminals D of Buffer/Timers 711 and 731 and both forward and reverse tram are prevented.

When a high tram is requested by the operator, a logical high will appear at input 1H and will cause LED 791 to light up. The logical high will also be input at terminal A of Buffer/Timer 793. Power is provided to Buffer/Timer 793 at terminal F from terminal A of Buffer/Timer 761. A timer in Buffer/Timer 793 analogous to timer 413 in FIG. 9 has a capacitor comparable to capacitor 421 of 2.2 microfarads a variable resistor comparable to 423 of 0-2 Megaohm. The time period for Buffer/Timer 793 is set at approximately 3 seconds which is longer than that of Buffer/Timers 711, 731 and 761. The time period commences when a logical high appears at terminal F of Buffer/Timer 793. In this way if low tram has been used for a while, then a transition to high tram may be quickly made. But if the operator immediately requests high tram, the operation will start in low tram and within 3 seconds the vehicle will go to high tram. When a logical high appears at terminal E of Buffer/Timer 793, OC's 795 and 797 will be triggered into a conducting state and there will be a conduction path at outputs a & b and c & d.

Figure 14:
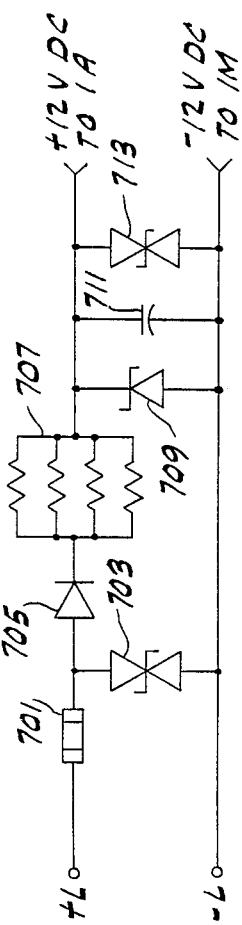
FIG. 14 is a schematic of the power supply shown in FIG. 3.

In FIG. 14 the +L and −L voltages are input to the power supply. One terminal of a fuse 701 is connected to +L and prevents excessive current. One terminal of metal oxide varistor 703 is connected to another terminal of fuse 701 and the other terminal of diode 703 is connected to the −L reference. A diode 705 and parallel resistors 707 are series connected and have one of their terminals connected to the other terminal of fuse 701. A zener diode 709, filter capacitor 711 and metal oxide varistor 713 are connected in parallel. One of the terminals of the parallel arrangement is connected to another terminal of the diode/resistor series arrangement and another terminal of the parallel arrangement is connected to −L. A +12 v and −12 v DC is supplied to the LOGIC UNIT from this power supply.

In view of the above, it will be seen that the several objects of the invention are achieved and other advantageous results attained.

As various changes could be made in the above constructions without departing from the scope of the invention, it is intended that all matter contained in the above description or shown in the accompanying drawings shall be interpreted as illustrative and not in a limiting sense.

What is claimed is:

1. A switching system for powering first and second electrical loads from a voltage supply, the electrical loads being operable from controls and connected to the voltage supply by the switching system, the switching system comprising:

electronic switch means having a control element which is responsive to a control voltage difference to cause said switch means to become conductive, said switch means having a switch terminal connected to a first supply line and another switch terminal connected to the first electrical load;

means responsive to the controls for generating the control voltage difference when the voltage supply is connected to the first supply line thereby powering the first electrical load from the first supply line;

means responsive to the controls for generating first and second control signals;

a first contactor, responsive to the first control signal, for connecting the voltage supply to a first supply line, the first electrical load connected to the first supply line; and a second contactor, responsive to the second control signal, for connecting the second supply line to the first supply line thereby connecting the voltage supply to the second supply line, and causing said means for generating the control voltage difference to interrupt power through the electronic switch means thereby discontinuing the supply of power to the first electrical load.

2. The switching system of claim 1 wherein said means for generating the control voltage difference comprises isolating means having an output terminal and having an input terminal responsive to a trigger signal for producing a connection at the output terminal; means connected to the controls for producing the trigger signal and means connected to the output terminal for generating said control voltage difference.

3. The switching system of claim 1 wherein said electronic switch means comprises a silicon controlled rectifier having an anode, a cathode and having a gate terminal responsive to the control voltage difference between the gate and the cathode.

4. The switching system of claim 3 wherein the voltage supply has a common line and said electronic switch means comprises a plurality of silicon controlled rectifiers, an anode of one of the silicon controlled rectifiers connected to the first supply line, the first electrical load being connected to a cathode of the one silicon controlled rectifier and a second silicon controlled rectifier having its anode connected to the electrical load and its cathode connected to the common line.

5. An electronic switch control system for use with a plurality of electronic switches to power an electrical load from a voltage supply, the electrical load being operable from controls, the supply having a voltage connection relative to a common, the electrical load adapted to be connected to the voltage connection by a first one of the electronic switches and to the common by a second one of the electronic switches, the electronic switches having a control element and being responsive to respective control voltage differences between the control element and a reference terminal, the electronic switch control system comprising:
  means for generating an electrical signal in response to one of the controls;
  first means, responsive to the electrical signal, for producing the control voltage difference to switch the first one of the electronic switches thereby connecting the electrical load to the voltage connection; and
  second means responsive to the electrical signal for producing the control voltage difference to switch the second one of the electronic switches thereby connecting the electrical load to the common; said first and second producing means being separate and independent from each other but being identical to each other whereby the number of replacement parts required is reduced and the servicing of the control system is simplified.

6. The electronic switch control system of claim 5 wherein said first and second producing means comprise a zener diode connected between the control element and the reference terminal, the control element being connected and responsive to the electrical signal.

7. The electronic switch control system of claim 5 wherein said first and second producing means comprise isolating means having an output terminal and having an input terminal responsive to a trigger signal for producing a connection at the output terminal, means connected to the controls for producing the trigger signal and means connected to the output terminal for generating said control voltage difference.

8. The electronic switch control system of claim 5 wherein said electronic switches comprise silicon controlled rectifiers each having an anode and a cathode as the reference terminal and each having a gate terminal as the control element responsive to the control voltage difference between the gate and the cathode.

9. An electronic switch control system for use with a plurality of electronic switches to power electrical loads from a voltage supply, the electrical loads being operable from controls, a first one of the electrical loads adapted to be connected to the voltage supply by a first one of the electronic switches and a second one of the electrical loads adapted to be connected to the voltage supply by a second one of the electronic switches, the electronic switches having a control element and being responsive to respective control voltage differences between the control element and a reference terminal, the electronic switch control system comprising:
  means for generating a first electrical signal in response to a first of the controls;
  first means responsive to the first electrical signal for producing the control voltage difference to switch the first one of the electronic switches thereby connecting the first electrical load to the voltage supply;
  means for generating a second electrical signal in response to a second of the controls;
  second means responsive to the second electrical signal for producing the control voltage difference to switch the second one of the electronic switches thereby connecting the second electrical load to the voltage supply; said first and second producing means being separate and independent from each other but being identical to each other whereby the number of replacement parts required is reduced and the servicing of the control system is simplified.

10. The electronic switch control system of claim 9 wherein said first and second producing means comprise a zener diode connected between the control element and the reference terminal, the control element being connected and responsive to the electrical signal.

11. The electronic switch control system of claim 9 wherein said first and second producing means comprise isolating means having an output terminal and having an input terminal responsive to a trigger signal for producing a connection at the output terminal, means connected to the controls for producing the trigger signal and means connected to the output terminal for generating said control voltage difference.

12. The electronic switch control system of claim 9 wherein said electronic switches comprise silicon controlled rectifiers each having an anode and a cathode as the reference terminal and each having a gate terminal as the control element responsive to the control voltage difference between the gate and the cathode.

13. An electronic switching system for powering an electrical load from a voltage supply, the electrical load being operable from controls and adapted to be connected to the voltage supply by the electronic switching system, the electronic switching system comprising:
  resistance means having a power rating which if exceeded for more than a predetermined time will cause burnout thereof;
  means responsive to the controls for connecting the voltage supply to the resistance means thereby to produce an electrical signal;
  electronic switch means having a control element which is responsive to a control voltage difference between the element and a reference terminal to cause said switch means to become conductive thereby connecting the electrical load to the voltage supply, the electronic switch means being subject to a failure in which the switch means will not become conductive even when the control voltage difference is applied; and
  means connected to the resistance means for producing the control voltage difference in response to the electrical signal whereupon if the electronic switch means becomes conductive in less than the predetermined time, the resistance means does not burn out and the electrical load is connected to the voltage supply, but if the electronic switch means fails to become conductive during the predetermined time period the resistance means burns out thereby providing a visible indication and a characteristic smell for easily identifying the failure of the electronic switch means.

14. The electronic switching system of claim 13 wherein said producing means comprises a zener diode connected between the control element and the reference terminal, the control element being connected and responsive to the electrical signal.

15. The electronic switching system of claim 13 wherein said connecting means comprises isolating means having an output terminal connected to the voltage supply and having an input terminal responsive to a trigger signal for producing a connection at the output terminal to the resistance means and means connected to the controls for producing the trigger signal.

16. The electronic switching system of claim 13 wherein said electronic switch means comprise a plurality of silicon controlled rectifiers each having an anode and a cathode as the reference terminal and each having a gate terminal as the control element responsive to the control voltage difference between the gate and the cathode.

* * * * *